United States Patent
Ye

(10) Patent No.: US 10,087,368 B2
(45) Date of Patent: Oct. 2, 2018

(54) HIGH-EFFICIENCY HIGH-QUALITY AND SAFE ALKALINE CUPRIC CHLORIDE ETCHANT FOR PRINTED CIRCUIT BOARD

(71) Applicant: Tao Ye, Guangzhou (CN)

(72) Inventor: Tao Ye, Guangzhou (CN)

( * ) Notice: Subject to any disclaimer, the term of this patent is extended or adjusted under 35 U.S.C. 154(b) by 0 days.

(21) Appl. No.: 14/720,990

(22) Filed: May 26, 2015

(65) Prior Publication Data

US 2015/0361341 A1 Dec. 17, 2015

(30) Foreign Application Priority Data

Jun. 16, 2014 (CN) .......................... 2014 1 0266826
Apr. 13, 2015 (CN) .......................... 2015 1 0176486

(51) Int. Cl.
| | |
|---|---|
| *C23F 1/18* | (2006.01) |
| *C23F 1/34* | (2006.01) |
| *C23F 1/40* | (2006.01) |
| *C23F 4/00* | (2006.01) |
| *C09K 13/00* | (2006.01) |
| *H05K 3/06* | (2006.01) |

(52) U.S. Cl.
CPC ................ *C09K 13/00* (2013.01); *C23F 1/18* (2013.01); *C23F 1/34* (2013.01); *C23F 1/40* (2013.01); *C23F 4/00* (2013.01); *H05K 3/067* (2013.01)

(58) Field of Classification Search
None
See application file for complete search history.

(56) References Cited

U.S. PATENT DOCUMENTS

| | | | | |
|---|---|---|---|---|
| 3,705,061 A | * | 12/1972 | King ......................... | C23F 1/34 134/10 |
| 5,524,780 A | * | 6/1996 | Krulik ....................... | C23F 1/46 216/93 |
| 6,426,020 B1 | * | 7/2002 | Okada ....................... | C23F 1/14 252/79.1 |

* cited by examiner

*Primary Examiner* — Stephanie P Duclair
(74) *Attorney, Agent, or Firm* — JCIPRNET

(57) ABSTRACT

A high-efficiency high-quality and safe alkaline cupric chloride etchant for printed circuit board, which includes cupric chloride and a sub-etchant. The sub-etchant contains (in percentage by weight) 10%-30% $NH_4Cl$; 0.0002%-25% carboxylic acid and/or ammonium carboxylate; 0.3%-25% ammonium hydroxide. The etchant is used in connection with an automatic detection and charging control during the etching process in order to keep the concentration of copper ions in the etchant no less than a set value.

15 Claims, No Drawings

HIGH-EFFICIENCY HIGH-QUALITY AND SAFE ALKALINE CUPRIC CHLORIDE ETCHANT FOR PRINTED CIRCUIT BOARD

FIELD OF THE INVENTION

The invention relates to an etchant for printed circuit board. More specifically, the invention relates to a high-efficiency, high-quality and safe alkaline cupric chloride etchant for printed circuit board.

BACKGROUND OF THE INVENTION

The etching process of a printed circuit board (PCB) is as follows: applying an etchant on a pre-developed copper-clad laminate and etching away the unprotected, non-conductor part of the PCB, in order to form a circuit. The etching of the non-conductor part utilises redox reactions between the etchant and the copper. Said pre-developed copper-clad laminate is made in previous processes and has a pattern.

At present, acidic cupric chloride etchant and alkaline cupric chloride etchant are two widely applied etching systems in industry. The acidic cupric chloride etchant employs cupric chloride ($CuCl_2$) as the copper etching agent, and applys an acidic oxidation system to achieve the regeneration of the copper etching agent. The copper etching agent of the alkaline cupric chloride etchant is copper(II) ammonia complex $Cu(NH_3)_4Cl_2$ formed from the complexation reaction between cupric chloride and ammonium hydroxide, and the etching agent is regenerated via a reaction involving oxygen, $NH_4^+$ and $Cl^-$.

The Etching Mechanism of Alkaline Cupric Chloride Etchant

The main components of existing alkaline cupric chloride etchants are copper(I) ammonia complex $Cu(NH_3)_4Cl_2$, ammonium chloride and ammonium hydroxide, wherein $Cu(NH_3)_4Cl_2$ is obtained from the complexation reaction between ammonium hydroxide and cupric chloride:

$$CuCl_2 + 4NH_4OH \rightarrow Cu(NH_3)_4Cl_2 + 4H_2O$$

And then, the copper on the printed circuit board is oxidised by $[Cu(NH_3)_4]^{2+}$:

$$Cu(NH_3)_4Cl_2 + Cu \rightarrow 2Cu(NH_3)_2Cl.$$

The copper(I) ammonia complex ions $[Cu(NH_3)_2]^+$ formed lack etching ability. When excessive $NH_4^+$ and $Cl^-$ are present in the etchant, $[Cu(NH_3)_2]^+$ are rapidly oxidised to copper(II) ammonia complex ion $[Cu(NH_3)_4]^{2+}$ by oxygen in the air, which can again participate in the copper etching process. Alternatively speaking, copper(II) ammonia complex ions $[Cu(NH_3)_4]^{2+}$ are regenerated:

$$4Cu(NH_3)_2Cl + 4NH_4Cl + 4NH_4OH + O_2 \rightarrow 4Cu(NH_3)_4Cl_2 + 6H_2O$$

Comparing to existing acidic cupric chloride etchants, alkaline cupric chloride etchants are increasingly used in large-scale industrial production due to their various advantages, including high and easily controlled etching rate, high copper etching ability, easy regeneration of the copper etching agent and low level of etch undercut.

The Etching Process of Existing Alkaline Cupric Chloride Etchants

As the components in the etchant change continuously during the etching process, an automatic detection and charging control machine is generally employed in industrial production to detect a specific density parameter of the etchant, in order to achieve automatic continuous regeneration of the alkaline cupric chloride etchant and thus maintain a stable etching rate. Generally, the etchant can be separated into the following two individual components, and each component can be charged according to its corresponding specific process parameter.

The two individual components are:
1. cupric chloride;
2. sub-etchant: generally a mixture of ammonium hydroxide and aqueous ammonium chloride solution.

In the process of preparing the etchant, the sub-etchant is firstly prepared by dissolving ammonium chloride in water and mixing the resultant aqueous ammonium chloride solution with ammonium hydroxide. The etchant is then obtained by adding cupric chloride into the sub-etchant, until the concentration of copper ions in the solution arrives at a prescribed value.

The mass of added cupric chloride is calculated according to formula 1:

$$\frac{\text{molar mass of } CuCl_2}{\text{molar mass of copper ion}} = \frac{\text{mass of } CuCl_2 \text{ to be added per liter of sub-etchant}}{\text{mass of copper ion to be added per liter of sub-etchant}} = \frac{\text{mass of pre-added } CuCl_2}{\text{mass of copper ions corresponding to } CuCl_2 \text{ pre-added}} \quad \text{(Formula 1)}$$

wherein the molar mass of cupric chloride is 134.5 g/mol, the molar mass of copper ion is 63.5 g/mol, and the mass of copper ion to be added into per liter of sub-etchant is the prescribed concentration of copper ions in the etchant (unit: g/L).

Assuming that the prescribed mass of copper ion to be added into per liter of sub-etchant is A g, the mass B of cupric chloride to be added into per liter of sub-etchant, according to formula 1, is $(A \times 134.5 \div 63.5)$ g.

A hydrometer on the automatic detection and charging control machine is used for measuring the specific density of the etchant obtained, and the charging control point of a specific density numerical control meter is set according to the measurement of the hydrometer. Alternatively speaking, the control point for charging the sub-etchant is set. Afterwards, the etchant is sprayed onto the surface of the printed circuit board to start the etching operation.

During the etching process, the etchant continuously reacts with copper, and the content of each component in the etchant changes accordingly. In order to achieve a stable etching rate as well as fulfil etching quality requirements, the automatic detection and charging control machine needs to be employed to supplement the sub-etchant. The machine can adjust the specific density of the etchant and keeps it constant at the preset value, so that concentrations of certain components in the etchant remain constant. As the reaction between the etchant and the copper on PCB proceeds, the copper content in the etchant is gradually increased, causing a gradual increase of specific density. When the specific density exceeds the preset value, the automatic detection and charging control machine adds sub-etchant into the etchant by controlling the corresponding charging pump, to reduce the specific density of the etchant. The salt concentration in the etchant is thus kept constant, the ammonium hydroxide and ammonium chloride required for the regeneration of copper(II) ammonia complex is replenished.

Additionally, the pH of the etchant is another important process parameter. A higher concentration of ammonium hydroxide in the etchant leads to larger pH of the etchant, higher regenerating rate of copper(II) ammonia complex, and therefore higher etching rate. In the prior art, the pH of the etchant is controlled by adjusting the pH of the sub-etchant via varying the concentration of ammonium hydroxide in the sub-etchant during its preparation.

An alkaline cupric chloride etchant with pH lower than 8.0 typically contains insufficient ammonium hydroxide, and thus low concentration of ammonium ions. On the one hand, the regeneration rate of copper(I) ammonia complex ion $[Cu(NH_3)_4]^{2+}$ is decreased, and the etching rate can hardly reach industrial production requirements. On the other hand, the low concentration of ammonium ions in the etchant results in the presence of a large amount of dissociated chloride ions in the etchant. These chloride ions are in excess, as the slow regeneration reaction is not able to consume all chloride ions, and they are likely to attack the tin etch resist layer instead, leading to corrosion of the tin etch resist layer. On the other hand, the amount of copper ions that cannot be converted into the water-soluble copper ammonia complex ions (due to the low concentration of ammonium ions) is increased, which leads to the formation of a large amount of copper sludge in the etchant. The main components of the copper sludge are $CuCl_2.NH_4Cl.2H_2O$ and cupric hydroxide. When a small amount of copper sludge is generated, it can be advantageously used as banking agent. However, when the amount of the copper sludge is too large, not only is the etching rate seriously affected, but also the pumps and nozzles on etching production lines are easily blocked. Additionally, the surface of the heater may easily form crust, which may lead to increased heat lost, and ultimately damages the heater. Hence at pH<8.0, it is difficult for the existing alkaline cupric chloride etchants to etch with adequate etching rate and etching quality, and so their pH is generally controlled within the range of from 8.3 to 10.

As the pH of the sub-etchant prepared is typically much higher than 8.0, the pH of the etchant is not further controlled and adjusted during the etching process. However, due to the extremely high volatility of ammonia, the concentration of ammonium hydroxide in the etchant will decrease when the ventilation system on the production line is operating on high power or if the etchant is allowed to stand unsealed during a temporary pause of production. The pH of the etchant will decrease, which leads to decreased etching rate. Therefore, if decrease in etching rate is noticed during production or when restarting etching operation after production pause, ammonium hydroxide may need to be replenished. Acid-base titration or a pH meter is required to manually measure the pH of the etchant, and by using known methods in the art, the required amount of ammonium hydroxide needed to be added to adjust the pH of the etchant until it arrives at the original set value is calculated, followed by manual addition of ammonium hydroxide. The existing etchants and etching processes thus have the following disadvantages:

1. During the etching process, the pH of the etchant is only controlled via adjusting the pH of the sub-etchant during its preparation. During the etching operation, there is no real-time and precise pH monitoring of the etchant. As ammonium hydroxide is either evaporated as ammonia, or consumed by the regeneration reaction of copper(II) ammonia complex, the pH of the etchant inevitably decreases during the etching process. When the pH of the sub-etchant prepared is relatively low (e.g. close to 8.0), it will easily drop below 8.0 as etching proceeds. In this case, not only is the etching rate extremely low, but also excessive copper sludge (comprising $CuCl_2.NH_4Cl.2H_2O$ and cupric hydroxide) may be formed, which will damage the etching equipment.
2. When ammonium hydroxide replenishment is necessary (e.g. when the pH of the etchant drops below 8.0), manual calculation of the amount of ammonium hydroxide required needs to be carried out in prior art, which is complicated, time-consuming and error-prone.
3. The replenishment of ammonium hydroxide also involves manual addition of ammonium hydroxide. Ammonium hydroxide is not only irritating and corrosive to eyes, nose and skin, but can also be toxic. Therefore, accidents may easily occur during the manual addition of ammonium hydroxide.

Etching Outerlayer PCBs with Fine-Line Circuits

As the degree of integration of electronic products increases, the demand for PCBs with fine-line circuits is ever increasing. Generally, "fine-line circuits" refers to circuits with line width and line spacing of below 75 μm, and the etching of such circuits requires the use of higher etching quality etchants. Etching quality is frequently discussed in terms of "etch factor", which indicates the level of etch undercut. In the etching process, the etchant not only etches downwards, but also etches in the left and right directions, referred to as "etch undercut". The etch factor (K) is the ratio of etching depth (D) to undercut width at one side (C) (namely K=D/C). When etching depth D is the same, a larger etch factor indicates a smaller undercut width; as the two side walls of the etched circuit is more vertical, the etching quality is better.

A major factor affecting undercut width is the amount of banking agent. Banking agent refers to a substance that is adhered to the two side walls of the circuit and can weaken the degree of attack on the two side walls by the etchant. When the amount of the banking agent is too small, the level of etch undercut is high and the etch factor is small.

In the field of printed circuit board, a fine-line PCB is typically a multiplayer PCB consisting of three or more laminates. A multilayer PCB consists of outerlayers and innerlayers, which are produced separately, before undergoing a laminating process to from the multilayer PCB. The copper foil of the outerlayer is relatively thick, mostly 1 oz or thicker. It is difficult to produce high-quality outerlayer PCBs with fine-line circuits, because:

1. Under the same etching production conditions, a thicker copper foil (i.e. larger etching depth D) leads to a larger undercut width C. Open-circuit and short-circuit is thus more likely to occur. When etching outerlayer PCBs with fine-line circuits (copper foil thickness of 1 oz, line width and line spacing of 50 μm) using existing acidic cupric chloride etchants, the etch factor obtained is typically less than 3, giving non-satisfactory etching results.
2. It has been noticed that alkaline cupric chloride etchants generally give larger etch factors comparing to acidic cupric chloride etchants, and are thus employed in the industrial production of outerlayer PCBs. However, due to the high concentration of ammonium hydroxide in the existing alkaline cupric chloride etchant, the pH of the etchant is relatively high, usually 8.3-10. The large amount of hydroxide ions present in the etchant can attack liquid and dry-film photoresists. It has been found that liquid photoresists are unstable at pH>7.5 and dry-film photoresists are unstable at pH>7.8. Tin etch resists, which are stable in basic conditions, are the only kind of resist layer that can be used. Tin-plated PCBs are relatively expensive, and the circuits developed on tin-plated PCBs are rarely as fine as those developed on PCBs coated with liquid or dry-film photoresists. Producing circuits with line width and line spacing of 75 μm or below using tin-plated PCBs has been found difficult. Theoretically, the corrosion of liquid and dry-film photoresists can be avoided by decreasing the ammonium hydroxide content, and thus lowering the pH of the etchant. As described above, however, the pH of existing alkaline cupric chloride etchants need to be maintained at no less than 8. As a result, the method currently employed in industry for etching fine-line outerlayer PCBs typically involves applying an alkaline cupric chloride etchant on PCBs coated with liquid or dry film photoresists. The pH of the etchant employed is typically very high, in order to achieve a sufficiently high etching rate, so that the etching process is completed before the liquid or dry film photoresists are completely corroded and stripped. However, the fine-line outerlayer PCBs produced using this method have unstable quality, high scrap rate and extremely unsatisfactory results.

Impacts on the Environment

The existing alkaline cupric chloride etchants give rise to a series of environmental problems 1. Alkaline cupric chloride etchants are typically only used in the etching of tin-plated PCBs. Industrial wastewater produced in the tin plating process can be difficult to treat, and can cause water and soil pollution. Tin smelter workers are continuously exposed to tin oxides in the production of tin-plated PCBs, which can lead to pulmonary stannosis.
2. The current method of treating alkaline cupric chloride etchant waste generally involves copper recovering and the subsequent sub-etchant recycling. The said etchant waste is mostly etchant overflowed from etchant tank during the etching process. Organic solvents are typically used to extract and recover copper from the etchant waste, albeit with high recovering cost and may contaminate the recycled sub-etchant. The organic solution waste produced can further cause environmental pollution. Copper recovering can alternatively be achieved using acid-base neutralisation, which involves adding a certain amount of hydrochloric acid into the alkaline cupric chloride waste, until its pH is adjusted to 6-7. At this point, $CuCl_2.NH_4Cl.2H_2O$ and cupric hydroxide precipitates are formed, which can react with sulphuric acid to form copper sulphate. The copper sulphate formed can be converted into refined copper by electrolysis. However, since the concentration of ammonium hydroxide in current alkaline cupric chloride etchants is relatively high, a large amount of HCl is required for neutralisation. As a result, a large amount of ammonium chloride solution is produced, which is difficult to be completely recycled and treated, and is mostly discharged as waste, causing huge waste of resources. Therefore, acid-base neutralisation is seldom applied at present.
3. As a high concentration of unreacted ammonium hydroxide is present in existing alkaline cupric chloride etchants, a large amount of irritating ammonia gas may be evolved by evaporation. Symptoms of mild ammonia gas poisoning by inhalation include rhinitis, laryngitis, sore throat and hoarse voice, and symptoms of moderate to severe ammonia gas poisoning include shortness of breath and asphyxia resulting from collapse of airways. This can be hazardous to the production staff, and can also cause air pollution.

In summary, existing alkaline cupric chloride etchants can corrode liquid and dry-film photoresists, causing various difficulties in the production of high-quality PCBs with fine-line circuits. Furthermore, a series of environmental problems may arise in the production of such PCBs.

SUMMARY OF THE INVENTION

As used herein, the singular forms "a", "an" and "the" are intended to include the plural forms as well, unless the context clearly indicates otherwise.

The present invention aims at providing a high-efficiency high-quality and safe alkaline cupric chloride etchant for printed circuit board. The said alkaline cupric chloride etchant not only maintains an etching rate that is no less than that of the prior art, but also improves etching quality, thereby meeting production requirements of printed circuit boards with fine-line circuits. Additionally, the said alkaline cupric chloride etchant could significantly reduce the amount of ammonium hydroxide lost via evaporation as ammonia gas, thereby reducing the amount of ammonium hydroxide that is required, lowering production cost. Most importantly, the health and safety of production staff can be promoted, and environmental pollution can be reduced.

Another aim of the present invention is to provide a process of utilising the alkaline cupric chloride etchant of the present invention in an etching operation. By precise and real-time control of pH of the etchant during the etching process, both the etching rate and etching quality are stabilised, thereby avoiding the damage of etching equipment, and further ensuring safety in production.

The first purpose of the invention is realised by the following technical proposal:

A high-efficiency high-quality and safe alkaline cupric chloride etchant for printed circuit board, comprising cupric chloride and a sub-etchant, wherein an automatic detection and charging control machine is used for controlling the specific density of the etchant during an etching process, in order to keep the concentration of copper ions in the etchant no less than a set value; the high-efficiency high-quality and safe alkaline cupric chloride etchant for printed circuit board is characterised in that:

1. the sub-etchant additionally comprises carboxylic add and/or ammonium carboxylate, and the sub-etchant comprises the following components in percentage by weight:

10%-30% $NH_4Cl$;

0.0002%-25% carboxylic acid and/or ammonium carboxylate;

0.3%-25% ammonium hydroxide;

and the balance of water;

(2) the initial charging amount B of the cupric chloride is obtained by calculation according to the following formula:

$$B=(134.5/63.5)\times\text{set value } A \text{ of the concentration of copper ions;}$$

process parameters of the etchant are set as follows: the concentration of copper ions is 30-170 g/L, the pH value is 7.0-8.8.

Preferably, the sub-etchant comprises the following components in percentage by weight
15/%-30% $NH_4Cl$;
0.81%-12.7% carboxylic acid and/or ammonium carboxylate;
0.5%-25% ammonium hydroxide;
and the balance of water.

More preferably, the sub-etchant comprises the following components in percentage by weight:
15%-25% $NH_4Cl$;
1%-8.5% carboxylic acid and/or ammonium carboxylate;
0.6%-20% ammonium hydroxide;
and the balance of water.

Preferably, the carboxylic acid is one or more compounds selected from the group consisting of formic add, citric acid and malic acid; the ammonium carboxylate is one or more compounds selected from the group consisting of ammonium formate, ammonium citrate and ammonium malate. Formic acid, citric acid, malic acid, ammonium formate, ammonium citrate and ammonium malate can all release carboxylate anions ($RCOO^-$) in the etchant, which is the actual active species. Therefore, there are no limitations on the mixing ratio of these compounds, as long as the percentage by weight of carboxylic acid and/or ammonium carboxylate added into the sub-etchant is within the range of the invention.

Preferably, the high-efficiency high-quality and safe alkaline cupric chloride etchant for printed circuit board is characterised in that the concentration of copper ions is 60-140 g/L, the pH value is 7.0-8.0. Such etchants are suitable for the etching of not only tin-plated PCBs, but also PCBs coated with dry-film and liquid photoresists.

The present invention can be further improved as follows:

The above-mentioned automatic detection and charging control machine can be used for additionally controlling the pH process parameter of the etchant during etching process, so that the pH of the etchant is always within a set numerical range.

The essence of the present invention lies in that one or more carboxylic acid(s) and/or ammonium carboxylate(s) are added into the sub-etchant, in which carboxylate anions ($RCOO^-$) is the actual active species. As carboxylic acid and ammonium carboxylate are interconvertible in the etchant, there are no limitations on the mixing ratio between carboxylic acid and ammonium carboxylate, as long as the total weight percentage of added carboxylic acid(s) and/or ammonium carboxylate(s) is within the range specified by the invention. In general, due to the high cost of ammonium carboxylate, the use of carboxylic acid is preferred.

The reasons for the addition of carboxylic acid and/or ammonium carboxylate into the etchant of the present invention are as follows:

1. the carboxylate anions in carboxylic acids and ammonium carboxylates provide temporary storage for ammonium ions in the etchant:

In the etchant of the present invention, carboxylic acids (RCOOH) and ammonium carboxylates ($RCOONH_4$) can be interconverted via the following reversible reaction:

$RCOOH+NH_4OH <=> RCOONH_4+H_2O$.

During the etching process when sufficient ammonium hydroxide ($NH_4OH$) is present in the etchant, the reaction equilibrium shifts to the right hand side, and the conversion of carboxylic acid to ammonium carboxylate (i.e. the forward reaction) is favoured. As ammonium hydroxide is consumed in the forward reaction, the amount of ammonium hydroxide in the etchant is reduced, and the concentration of hydroxide ions is thus significantly lowered, leading to a decrease in pH of the etchant. However, this decrease in pH is not accompanied by a drop in etching rate, as the overall concentration of ammonium ions contained in the etchant is not decreased. When there is insufficient dissociated ammonium ions in the etchant, the reaction equilibrium shifts to the left hand side, and ammonium ions $NH_4^+$ are released from ammonium carboxylate to take part in the regeneration reaction of copper(II) ammonia complex ion $[Cu(NH_3)_4]^{2+}$.

2. The overall etching ability of the etchant is enhanced:

According to the above discussion, at the same pH and copper ion concentration, the etchant of the present invention has a higher concentration of ammonium ions than that of the prior art. The high concentration of ammonium ions accelerates the regeneration reaction of $[Cu(NH_3)_4]^{2+}$, so that the etching rate is increased. In addition, a large amount of oxygen is brought into the etchant by the spray system on the etching production line during the etching operation. At working temperature (about 50° C.), upon contacting with oxygen, cupric oxide (CuO) and $Cu_2(OH)_2CO_3$ are rapidly formed on the copper surface of the PCB, which hinders the etching process. The carboxylic acids added into the etchant can react with CuO and $Cu_2(OH)_2CO_3$ directly:

$CuO+2RCOOH \rightarrow Cu(RCO_2)_2+H_2O$, $Cu_2(OH)_2CO_3+4RCOOH \rightarrow 2Cu(RCO_2)_2+3H_2O+CO_2$ The ammonium carboxylates added can react with CuO and $Cu_2(OH)_2CO_3$ in the same manner after being converted into carboxylic acid. The increased concentration of ammonium ions and the removal of CuO/$Cu_2(OH)_2CO_3$ by carboxylic acids results in an overall enhancement of the etching ability of the etchant.

3. The carboxyl group of the carboxylic acid can form hydrogen bonding with hydroxide ions in the etchant, lowering the concentration of free hydroxide ions in the etchant without decreasing the overall concentration of ammonium ions. Alternatively speaking, the amount of species that will attack dry-film or liquid photoresists is reduced without affecting the overall etching rate.

4. According to long-term studies by the inventor, more banking agent is present during the etching process when using an etchant of the present invention comparing to using that of the prior art, when the overall amount of ammonium ions in both etchants is the same. The main components of the banking agent formed are cupric hydroxide and $CuCl_2.NH_4Cl.2H_2O$. A possible reason of the increased level of banking agent present is that the ammonium ions in the etchant of the invention exist mainly in the form of ammonium carboxylate, whereas those in the prior art exist in the form of ammonium hydroxide. It is understood that the tightly bound ammonium ions in ammonium carboxylate needs to be dissociated into free ammonium ions, before participating in complexation reactions that lead to the dissolution of banking agent. On the contrary, in existing etchants, the ammonium ions are only weakly binded to hydroxide ions. The rate of dissociation of ammonium ions from ammonium hydroxide is much faster, resulting in an increased rate of dissolution of the banking agent, which eventually leads to decreased amount of banking agent present.

The present invention also makes the following improvements to the etching process:

a process of utilising the alkaline cupric chloride etchant of the present invention, comprising the steps of:

Step 1 preparing the sub-etchant: at ambient temperature and pressure, according to designated components of the sub-etchant and their mixing ratio, selected raw materials are dissolved in water to prepare the sub-etchant;

Step 2 calculating the initial charging amount of the cupric chloride: the cupric chloride is added into the sub-etchant obtained in step 1 according to a set value of the concentration of copper ions; the initial charging amount B of the cupric chloride is calculated according to the following formula:

$$B = (134.5/63.5) \times \text{set value } A \text{ of the concentration of copper ions;}$$

Step 3 Setting up specific density and pH value detection: the solution obtained in step 2 is poured into an etchant tank on a printed circuit board production line, and sensor probes of the specific density control system and the automatic detection and charging system for ammonium hydroxide are immersed into the etchant, in order to detect and control the specific density and the pH value of the etchant;

Step 4 Replenishing the supplement tanks: the sub-etchant prepared in step 1 is poured into the sub-etchant supplement tank, which is connected to the specific density control system; the ammonium hydroxide is poured into the ammonium hydroxide supplement tank, which is connected to the automatic detection and charging system for ammonium hydroxide;

Step 5 Setting the process parameters: the temperature of the etchant tank is set to 45-50° C., the pressure of spray nozzles of the automatic detection and charging control machine is set to 2-3 kg/cm$^2$, charging control point of the specific density control system is set according to the reading of a hydrometer in the specific density control system of the automatic detection and charging control machine, and pH charging control point of the automatic detection and charging system for ammonium hydroxide is set according to a prescribed pH value; the automatic detection and charging control machine is started and the alkaline cupric chloride etchant is prepared;

Step 6 Conducting the etching operation: the etching operation is started; the various process parameters are measured by the automatic detection and charging control machine during the etching operation; the machine automatically controls the supplementation of the various components of the etchant, thereby balancing the amount of each component in the etchant.

The present invention can be further improved as follows:

As cupric chloride is expensive, a small amount (1 g/L or more) of cupric chloride can be pre-added, and an appropriate amount of copper is then added into the sub-etchant instead of cupric chloride, supplementing the required concentration of copper ions. For example, one mole of copper can react with one mole of $Cu(NH_3)_4Cl_2$ present in the etchant to generate two moles of $Cu(NH_3)_2Cl$. The two moles of $Cu(NH_3)_2Cl$ further reacts with oxygen, ammonium hydroxide and ammonium chloride to produce two moles $Cu(NH_3)_4Cl_2$, which is the copper etching agent. In this manner, the consumption of cupric chloride can be reduced.

The mass of copper to be incorporated can be calculated according to formula 1 described above and formula 2 below.

$$\frac{\text{molar mass of copper}}{\text{molar mass of copper ion}} = \frac{\text{mass of copper to be added into per liter of sub-etchant}}{\text{mass of copper ion to be added into per liter of sub-etchant}} \quad \text{(Formula 2)}$$

Wherein the molar mass of copper is equivalent to the molar mass of copper ion, which is 63.5 g/mol. Therefore, the mass of copper to be added into per liter of sub-etchant equals to the mass of copper ion to be added into per liter of sub-etchant.

Assuming that the total mass of copper ions to be added into per liter of sub-etchant is Ag. After B' g of cupric chloride is pre-added, the mass of copper ions to be added into per liter of sub-etchant becomes A−(B'×63.5÷134.5) g. It can be deduced from formula 2 that the mass of copper to be added into per liter of sub-etchant is equal to the mass of copper ions to be added into per liter of sub-etchant, so that after B' g of cupric chloride is added into per liter of sub-etchant, A−(B'×63.5÷134.5) g of copper needs to be further added to achieve the set mass of copper ions in per liter of sub-etchant.

Comparing with the Prior Art, the Present Invention has the Following Beneficial Effects:

1. High etching rate: the sub-etchant of the invention contains carboxylic acid and/or ammonium carboxylate, which can act as temporary storage of ammonium ions: ammonium ions are released when the amount of dissociated ammonium ions is insufficient in the etchant. Therefore, at the same pH value and concentration of copper ions, the concentration of ammonium ions in the etchant is higher than that in the prior art. A high concentration of ammonium ions accelerates the regeneration reaction of copper(II) ammonia complex, significantly increasing etching rate. Furthermore, as discussed above, carboxylic acid and/or ammonium carboxylate can assist the etching process by reacting with CuO and $Cu_2(OH)_2CO_3$ on the surface of copper during the etching process. According to experimental data, the etching rate of etchants of the present invention can be twice of that of the prior art or higher. The requirements of large-scale high-efficiency production can be better fulfilled, and the energy consumed as well as the man-power required for producing a single product is greatly reduced.

2. High etching quality: with the same overall amount of ammonium ions in the etchant, comparing to etchants of prior art, more banking agent are present when using the etchant of the invention. As a result, the level of etch undercut is reduced, the product quality is improved, the requirements of etching outerlayer PCBs with fine-line circuits are met.

3. Production cost is reduced: with the same etching rate and concentration of copper ions, comparing to prior art, the etchant of the present invention has lower pH and contains less ammonium hydroxide. The evaporation of ammonia is thus reduced, and the overall consumption of ammonium hydroxide is reduced. With improving etching quality, the scrap rate of the PCBs produced can be effectively decreased, and production cost can be further reduced.

4. Etchants with pH<8.0 can be applied in the industrial production of tin-plated PCBs: etchants of the present invention maintain high etching rates, with much reduced copper sludge formation at pH<8.0. The damage of heaters and blockage of pumps and nozzles on etching production lines caused by the copper sludge can therefore be avoided. In addition, the etchant contains sufficient ammonium ions, so that a decrease in the regeneration rate of $[Cu(NH_3)_4]^{2+}$ one might expect due to the decreased ammonium hydroxide content in the etchant is effectively prevented. As a result, all the dissociated chloride ions present in the etchant are consumed by the regeneration reaction in due time, and so the attack of the tin etch resist layer by these chloride ions is prevented.
5. The quality of outerlayer PCBs with fine-line circuits produced is greatly improved: at pH 7.0-7.8, the etchant of the invention can maintain a relatively high etching rate and good etching quality. More importantly, it can also be employed in the production of fine-line PCBs that are coated with liquid or dry-film photoresists, without corroding such photoresists. The current difficulties encountered in the etching of outerlayer PCBs with fine-line circuits, including unstable etching rate and high scrap rate, both caused by the corrosion of liquid or dry-film photoresists by existing etchants, are fundamentally resolved.
6. Production safety is significantly improved and environmental impacts are reduced: comparing to etchants of the prior art, at the same etching rate and concentration of copper ions, the etchant of the invention has lower pH and contains less unreacted ammonium hydroxide, which leads to reduced evaporation of ammonia, promoting health and wellbeing of the production staff and reducing air pollution. At pH≤7.8, etchants of the present invention will neither attack liquid nor dry-film photoresists, therefore the use of tin etch resist layer can be avoided. Metal pollution and industrial wastewater produced during the tin-plating process of PCB can thus be prevented.
7. Precise control of pH of the etchant: a binary control system is employed in the invention to control the amount of each component in the etchant. Specifically, an automatic detection and charging control machine is used to simultaneously control the pH and the specific density of the etchant. Comparing to the conventional unitary control system, which only controls the specific density of the etchant the etchant, the binary control system of the invention monitors pH in real time, effectively preventing the decrease of ammonium hydroxide concentration during etching, thereby maintaining stable etching rate and high etching quality, as well as avoiding the damage of etching equipment by copper sludge produced at low ammonium hydroxide concentration. In addition, safety accidents that may occur during the manual handling of ammonium hydroxide can be avoided; the binary control system disclosed in the present invention is both simple and efficient, and can prevent manual calculation mistakes which may eventually lead to inaccurate amount of ammonium hydroxide being replenished;
8. Easy, safe and low-cost copper recovering: when the pH of the etchant of the invention is lower than 8.0, acid-base neutralisation can be directly applied to recover copper from etchant waste without producing excessive ammonium chloride solution, since the concentration of ammonium hydroxide in the etchant waste is relatively low. Furthermore, the treated waste solution containing ammonium chloride can be adjusted to contain all required components in adequate amounts, so that it can be reused as sub-etchant in the etching production line, avoiding waste of resources. The acid-base neutralisation method is safe, easy to operate and low-cost, and more importantly, problems encountered currently in the recycling of etchant waste, such as contamination of the recycled sub-etchant by organic solvents and environmental pollution are avoided.

DETAILED DESCRIPTION OF THE EMBODIMENTS

The invention is further described by the following exemplary embodiments. It should be understood that the description and specific examples are intended for purposes of illustration only and are not intended to limit the scope of the present disclosure. Nonessential modification and adjustments made by other people according to the invention still belong to the protection scope of the invention.

In the following exemplary embodiments and comparative examples, the ammonium chloride used is preferably ammonium chloride produced by Guangzhou Chemical Reagent Factory; the formic acid used is preferably formic acid produced by Guangzhou Chemical Reagent Factory; the ammonium formate used is preferably ammonium formate produced by Guangzhou Chemical Reagent Factory; the ammonium hydroxide used is preferably ammonium hydroxide produced by Guangzhou Chemical Reagent Factory; the cupric chloride used is preferably $CuCl_2.2H_2O$ (≥99.0%) produced by Guangzhou Chemical Reagent Factory; the copper used is preferably copper powder produced by Guangzhou Chemical Reagent Factory; the hydrochloric acid used is preferably 36.5% hydrochloric acid solution produced by Guangzhou Chemical Reagent Factory; the citric acid used is preferably citric acid produced by Guangzhou Chemical Reagent Factory; the malic acid used is preferably DL-malic acid produced by Guangzhou Chemical Reagent Factory; the ammonium citrate used is preferably ammonium citrate produced by Guangzhou Chemical Reagent Factory; the ammonium malate used is preferably ammonium malate produced by Xi'an Dafengshou Biotech Co., Ltd. The automatic detection and charging control machines used are preferably Yegao PCB alkaline etching automatic charging control machine type-2 for the alkaline cupric chloride etching systems and Yegao PCB acidic etching automatic charging control machine type-2 for the acidic cupric chloride etching systems, both of which are produced by Guangzhou Yegao Chemical Co., Ltd. In addition to the above-listed products, those of skill in the art can also select products and equipments with similar properties to those listed herein according to conventional choices to achieve the object of the current invention.

Embodiment 1

Binary control system was employed in the embodiment to control the amount of each component in the etchant.

Step 1: at ambient temperature and pressure, according to the designated components as illustrated in Table 1 below, selected raw materials are dissolved in water to prepare the sub-etchant; 25% ammonium hydroxide was prepared.

Step 2: cupric chloride was added into per liter of the sub-etchant obtained in step 1; the added amount of cupric chloride was obtained by calculation according to the set value of the concentration of copper ions in the solution listed in Table 1:

$$\frac{\text{molar mass of } CuCl_2}{\text{molar mass of copper ion}} = \frac{\text{mass of } CuCl_2 \text{ to be added per liter of sub-etchant}}{\text{mass of copper ion to be added per liter of sub-etchant}} = \frac{\text{mass of pre-added } CuCl_2}{\text{mass of copper ions corresponding to } CuCl_2 \text{ pre-added}}$$ (Formula 1)

Wherein the molar mass of cupric chloride is 134.5 g/mol; and the molar mass of copper ion is 63.5 g/mol. The mass of copper ion to be added into per liter of sub-etchant is 130 g according to the value specified in embodiment 1 of Table 1. Therefore, the mass B of cupric chloride to be added into per liter of sub-etchant is 134.5×130÷63.5=275.4 g.

Step 3: the solution obtained in step 2 was poured into an etchant tank, and sensor probes of the automatic detection and charging control machine were immersed into the etchant in order to detect and control various process parameters.

Step 4: the 25% of ammonium hydroxide obtained in step 1 was poured into an ammonium hydroxide supplement tank, which was connected to a charging pump controlled by a pH numerical control meter of the automatic detection and charging control machine; the sub-etchant obtained in step 1 was poured into a sub-etchant supplement tank, which was connected to a charging pump controlled by a specific density numerical control meter of the automatic detection and charging control machine.

Step 5: the temperature of the etchant tank was set to 50° C., the pressure of spray nozzles of the automatic detection and charging control machine was set to 2 kg/cm², and the pH value was set as the value specified in Table 1. The automatic detection and charging control machine was started and the etchant was prepared; when the pH of the etchant arrived at the set numerical value, the numerical value of the specific density numerical control meter was set according to the reading of a hydrometer on the automatic detection and charging control machine.

Step 6: the etching operation was started. All the components in the etchant were automatically charged and balanced by the automatic detection and charging control machine, keeping the pH value and the specific density at the numerical values specified.

An etch factor test was carried out using PCBs with size of 620×540 mm, copper foil thickness of 1 oz, line width and line spacing of 50.8 μm. A pure copper etching rate test board with size of 500×300 mm×1.5 mm was employed for spray corrosion testing. The etching rate and etch factor K were calculated using methods known in the art, e.g., those described in *Printed Circuit Technique* by Li Xueming, Occupational Skill Testing Authority of Electronic Industry of Ministry of Industry and Information Technology, fifth edition, p 387-389; "Theory and Application of Metal Corrosion", Wei Baoming, Chemical Industry Press, p 5-7; *Discussion in Methods of Etch Factor Calculation*, Tian Ling, et al., printed circuit information, 2007 No. 12, p 55-56. The calculated results of etching rate and etch factor K are presented in able 2.

Embodiments 2-3

The procedures of embodiment 1 were repeated respectively, using the designated content of each component and parameters of the automatic detection and charging control machine as specified in embodiments 2-3 of Table 1 below. Wherein in step 2, 2 g of cupric chloride was first added into per liter of the sub-etchant obtained in step 1, and then copper was added to allow the concentration of copper ions in the obtained solution to reach the value specified in embodiments 2-3 of Table 1 (i.e. 130 g/L). According to formula 1 and formula 2 described in the background of the invention, the mass of copper added was 130−(2× 63.5÷134.5)=129 g.

Embodiments 4-10

The procedures of embodiment 1 were repeated respectively, using the designated content of each component and parameters of the automatic detection and charging control machine as specified in embodiments 4-10 of Table 1 below. Wherein in step 2, 254.2 g of cupric chloride was added into per liter of the sub-etchant obtained in step 1 to allow the concentration of copper ions in the obtained solution to reach the value specified in embodiments 4-10 of Table 1.

In embodiments 4-10, the composition of the sub-etchant, the concentration of copper ions, and the specific density of the automatic detection and charging control machine are identical but the pH values are different. It is shown from the results that as the pH of the etchant increases, the etching rate increases.

Embodiment 11

The procedures of embodiment 1 were repeated respectively, using the designated content of each component and parameters of the automatic detection and charging control machine as specified in embodiment 11 of Table 1 below.

Embodiment 12

The procedures of embodiment 1 were repeated respectively, using the designated content of each component and parameters of the automatic detection and charging control machine as specified in embodiment 12 of Table 1 below, where in step 1, the concentration of ammonium hydroxide prepared was 15%; in step 2, 63.5 g of cupric chloride was added into per liter of the sub-etchant obtained in step 1 to allow the concentration of copper ions in the obtained solution to reach the value specified in embodiment 12 of Table 1.

Embodiment 13

The procedures of embodiment 1 were repeated respectively, using the designated content of each component and parameters of the automatic detection and charging control machine as specified in embodiment 13 of Table 1 below, wherein in step 1, the concentration of ammonium hydroxide prepared was 15%; in step 2, 127.1 g of cupric chloride was added into per liter of the sub-etchant obtained in step 1 to allow the concentration of copper ions in the obtained solution to reach the value specified in embodiment 13 of Table 1.

Embodiment 14

The procedures of embodiment 1 were repeated respectively, using the designated content of each component and parameters of the automatic detection and charging control machine as specified in embodiment 14 of Table 1 below, wherein in step 1, the concentration of ammonium hydroxide prepared was 20%; in step 2, 190.6 g of cupric chloride was added into per liter of the sub-etchant obtained in step 1 to allow the concentration of copper ions in the obtained solution to reach the value specified in embodiment 14 of Table 1.

Embodiment 15

The procedures of embodiment 1 were repeated respectively, using the designated content of each component and parameters of the automatic detection and charging control machine as specified in embodiment 15 of Table 1 below, wherein in step 1, the concentration of ammonium hydroxide prepared was 20%; in step 2, 241.5 g of cupric chloride was added into per liter of the sub-etchant obtained in step 1 to allow the concentration of copper ions in the obtained solution to reach the value specified in embodiment 15 of Table 1.

In embodiments 12-15, the composition of the sub-etchant and the pH parameter of the automatic detection and charging control machine are the same, but the concentration of copper ions are different. From the results, it can be shown that the etching rate increases with increased concentration of copper ions. However, when the concentration of copper ions is too high (e.g. embodiment 15), the etching rate is relatively low due to the etchant being oversaturated.

Embodiment 16

The procedures of embodiment 1 were repeated respectively, using the designated content of each component and parameters of the automatic detection and charging control machine as specified in embodiment 16 of Table 1 below, wherein in step 2, 296.5 g of cupric chloride was added into per liter of the sub-etchant obtained in step 1 to allow the concentration of copper ions in the obtained solution to reach the value specified in embodiment 16 of Table 1.

Embodiment 17

The procedures of embodiment 1 were repeated respectively, using the designated content of each component and parameters of the automatic detection and charging control machine as specified in embodiment 17 of Table 1 below, wherein in step 2, 360.1 g of cupric chloride was added into per liter of the sub-etchant obtained in step 1 to allow the concentration of copper ions in the obtained solution to reach the value specified in embodiment 17 of Table 1.

Embodiment 18

Unitary control system was employed in the embodiment to control the amount of each component in the etchant.

Step 1: at ambient temperature and pressure, according to the designated components as listed in Table 1 below, selected raw materials are dissolved in water to prepare the sub-etchant.

Step 2: 254.2 g of cupric chloride was added into per liter of the sub-etchant obtained in step 1 to allow the concentration of copper ions in the obtained solution to reach the value specified in embodiment 18 of Table 1; the added amount of cupric chloride was obtained by calculation using formula 1 as described in the background section.

Step 3: the solution obtained in step 2 was poured into an etchant tank, and sensor probes of the automatic detection and charging control machine were immersed into the etchant in order to detect and control various parameters.

Step 4: the sub-etchant obtained in step 1 was poured into a sub-etchant tank, which was connected to the charging pump controlled by a specific density numerical control meter of the automatic detection and charging control machine; the temperature of the etchant tank was set to 50° C., the pressure of spray nozzles of the etching machine was set to 2 kg/cm$^2$.

Step 5: the pH value of the etchant was measured using a pH meter on the automatic detection and charging control machine, and ammonium hydroxide or water was appropriately supplemented until the pH value arrived at the set value; the numerical value of the specific density numerical control meter was set according to the reading of a hydrometer on the automatic detection and charging control machine; the automatic detection and charging control machine was started.

Step 6: the etching operation was started. The sub-etchant was automatically charged and all the components in the etchant were supplemented and balanced by the automatic detection and charging control machine, keeping the specific density of the etchant at the numerical values specified in Table 1.

An etch factor test was carried out using PCBs with size of 620×540 mm, copper foil thickness of 1 oz, line width and line spacing of 50.8 μm. A pure copper etching rate test board with size of 500×300 mm×1.5 mm was employed for spray corrosion testing. The etching rate and etch factor K were calculated using methods known in the art. The automatic detection and charging control machine would automatically recharge and balance each component in the etchant, keeping the specific density at the numerical values specified in Table 1. The calculated results of etching rate and etch factor K are recorded in Table 2.

Embodiments 19-23

The procedures of embodiment 1 were repeated respectively, using the designated content of each component and parameters of the automatic detection and charging control machine as specified in embodiments 19-23 of Table 1 below, wherein in step 2, 254.2 g of cupric chloride was added into per liter of the sub-etchant obtained in step 1 to allow the concentration of copper ions in the obtained solution to reach the value specified in embodiments 19-23 of Table 1.

In embodiments 20-23, the concentration of copper ions and the pH parameter of the automatic detection and charging control machine are set to be the same, but the concentration of carboxylic acid in the sub-etchant are different. From the results, it can be seen that the etching rate increases as concentration of carboxylic acid increases when the concentration of carboxylic acid is relatively low. However, when the concentration of carboxylic acid is high, its effect on increasing etching rate decreases as the solution is relatively saturated.

Embodiment 24

The procedures of embodiment 1 were repeated respectively, using the designated content of each component and parameters of the automatic detection and charging control machine as specified in embodiment 24 of Table 1 below, wherein in step 1, the concentration of ammonium hydroxide prepared was 20%; in step 2, 127.1 g of cupric chloride was added into per liter of the sub-etchant obtained in step 1 to allow the concentration of copper ions in the obtained solution to reach the value specified in embodiment 24 of Table 1.

Embodiments 25-27

The procedures of embodiment 1 were repeated respectively, using the designated content of each component and parameters of the automatic detection and charging control machine as specified in embodiments 25-27 of Table 1 below. Wherein in step 1, the concentration of ammonium hydroxide prepared was 20%; in step 2, 169.4 g of cupric chloride was added into per liter of the sub-etchant obtained in step 1 to allow the concentration of copper ions in the obtained solution to reach the value specified in embodiments 25-27 of Table 1.

In embodiments 25-27, the concentration of carboxylic acid and the concentration of ammonium hydroxide in the sub-etchant are the same, as well as the concentration of copper ions and the pH value of the etchant. However, the concentration of ammonium chloride in the sub-etchant is different. From the results, it can be seen that the etching rate increases with increasing concentration of ammonium chloride, as ammonium chloride takes part in the regeneration reaction of copper(II) ammonia complex.

Embodiments 28-30

The procedures of embodiment 1 were repeated respectively, using the designated content of each component and parameters of the automatic detection and charging control machine as specified in embodiments 28-30 of Table 1 below, wherein in step 2, 254.2 g of cupric chloride was added into per liter of the sub-etchant obtained in step 1 to allow the concentration of copper ions in the obtained solution to reach the value specified in embodiments 28-30 of Table 1.

Comparative Example 1

Step 1: at ambient temperature and pressure, according to the designated components as listed in Table 1 below, selected raw materials are dissolved in water to prepare the sub-etchant.

Step 2: 275.4 g of cupric chloride was added into per liter of the sub-etchant obtained in step 1 to allow the concentration of copper ions in the obtained solution to reach the value specified in comparative example 1 of Table 1; the added amount of cupric chloride was obtained by calculation using formula 1.

Step 3: the solution obtained in step 2 was poured into an etchant tank, and sensor probes of the automatic detection and charging control machine were immersed into the etchant in order to detect and control various parameters.

Step 4: the sub-etchant obtained in step 1 was poured into a sub-etchant tank, which was connected to the charging pump controlled by a specific density numerical control meter of the automatic detection and charging control machine; the temperature of the etchant tank was set to 50° C., the pressure of spray nozzles of the etching machine was set as 2 kg/cm$^2$.

Step 5: the pH value of the etchant was measured using the pH meter on the automatic detection and charging control machine, and ammonium hydroxide or water was appropriately supplemented until the pH value arrived at the set value; the numerical value of the specific density numerical control meter was set according to the reading of a hydrometer on the automatic detection and charging control machine; the automatic detection and charging control machine was started.

Step 6: the etching operation was started. The sub-etchant was automatically charged and all the components in the etchant were balanced by the automatic detection and charging control machine, keeping the specific density at the numerical values specified in Table 1.

An etch factor test was carried out using PCBs with size of 620×540 mm, copper foil thickness of 1 oz, line width and line spacing of 50.8 μm. A pure copper etching rate test board with size of 500×300 mm×1.5 mm was employed for spray corrosion testing. The etching rate and etch factor K were calculated using methods known in the art. The automatic detection and charging control machine would automatically recharge and balance each component in the etchant, keeping the specific density at the numerical values specified in Table 1. The calculated results of etching rate and etch factor K are recorded in Table 2.

Comparative Examples 2-4

The procedures of comparative example 1 were repeated respectively, using the designated content of each component and parameters of the automatic detection and charging control machine as specified in comparative examples 2-4 of Table 1 below wherein in step 2, 254.2 g of cupric chloride was added into per liter of the sub-etchant obtained in step 1 to allow the concentration of copper ions in the obtained solution to reach the value specified in comparative examples 2-4 of Table 1.

Comparative Example 5

Step 1: at ambient temperature and pressure, 31 wt % of HCl was dissolved in water to prepare a sub-etchant; $H_2O_2$ was used as an oxidant, and was prepared into a solution of 27.5% $H_2O_2$.

Step 2: 254.2 g of cupric chloride was added into per liter of the sub-etchant obtained in step 1 to allow the concentration of copper ions in the obtained solution to arrive at 120 g/L. The mass of cupric chloride added was calculated according to formula 1 in the background section.

Step 3: the solution obtained in step 2 was poured into an etchant tank, and sensor probes of the automatic detection and charging control machine were immersed into the etchant in order to detect and control various parameters.

step 4: the oxidant (27.5% $H_2O_2$) was poured into an oxidant tank, which was connected to a charging pump controlled by an ORP numerical control meter of the automatic detection and charging control machine; the sub-etchant was poured into a sub-etchant tank, which was connected to a charging pump controlled by a dissociated hydrogen ion concentration meter of the automatic detection and charging control machine; water was poured into a water tank which was connected to a charging pump controlled by a specific density numerical control meter of the automatic detection and charging control machine.

Step 5: the temperature of the etchant tank was set to 49° C., the pressure of spray nozzles of the etching machine was set to 2 kg/cm$^2$, the concentration of dissociated hydrogen ions was set to 3.0M, and the oxidation-reduction potential (ORP) was set to 54 mV. The automatic detection and charging control machine was started and the etchant was prepared; when the concentration of dissociated hydrogen ions and the ORP in the etchant arrived at the set numerical values, the numerical value of the specific density numerical control meter was set according to the reading of a hydrometer on the automatic detection and charging control machine.

Step 6: the etching operation was started. All the components in the etchant were automatically charged and balanced by the automatic detection and charging control machine, keeping the concentration of dissociated hydrogen ions, the oxidation-reduction potential and the specific density at the numerical values specified in Table 1.

An etch factor test was carried out using printed circuit boards with size of 620×540 mm, copper foil thickness of 1 oz, line width and line spacing of 50.8 μm. A pure copper etching rate test board with size of 500×300 mm×1.5 mm was employed for spray corrosion testing. The etching rate and the etch factor K were calculated using methods known in the art. The calculated results of etching rate and etch factor K are recorded in Table 2.

Testing the Impact of Etchant on Liquid and Dry Film Photoresists:

In comparative example 1 and embodiments 4, 8, 15 and 28, when the various process parameters arrived at set numerical values, printed circuit test boards with the size of 500×300 mm×1.5 mm, and are coated with either liquid or dry film photoresists, were employed for spray corrosion testing in the etching machine for 1 min. The automatic detection and charging control machine automatically recharged and balanced each component in the etchant, keeping the pH value and the specific density at prescribed numerical values specified in Table 1. The liquid or dry film photoresists were carefully scrutinised and gently scratched using equipment in order to observe whether there is discolouration, softening or stripping of the photoresists.

Data Analysis of Table 1 and 2:

The etching rates of comparative example 2 and embodiments 19 and 21 are similar, all within the range of from 39.1 to 41.2 μm/min; they have identical concentration of copper ions (120 g/L). The pH of comparative example 2 is 8.6, and that of embodiments 19 and 21 are 8.2 and 7.7 respectively; the etch factor of comparative example 2 is 3.6, and that of embodiments 19 and 21 are 5.2 and 7.2 respectively.

The etching rate of comparative example 3 (36.0 μm/min) is similar to that of embodiment 5 (35.3 μm/min); they have identical concentration of copper ions (120 g/L). The pH of comparative example 3 is 8.3, and that of embodiment 5 is 7.2; the etch factor of comparative example 3 is 4.2, whereas that of embodiment 5 is 11.0.

The etching rate of comparative example 4 (28.6 μm/min) is similar to that of embodiment 23 (31.0 μm/min); both embodiments have identical concentration of copper ions (120 g/L). The pH of comparative example 4 is 8.0, and that of embodiment 23 is 7.7; the etch factor of comparative example 4 is 4.7, whereas that of embodiment 23 is 7.3.

In conclusion, at the same or similar etching rates and concentrations of copper ions, the alkaline cupric chloride etchant of the invention has lower pH value and larger etch factor comparing to alkaline cupric chloride etchants of the prior art.

The pH value and the concentration of copper ions in comparative example 1 are the same as those in embodiment 11, but embodiment 11 has an etching rate which is 1.96 times of that of comparative example 1, and its etch factor is 1.11 times of that of comparative example 1.

Comparative example 2, embodiment 10 and embodiment 18 have the same pH value and concentration of copper ions, whereas the etching rate of embodiment 10 is 1.96 times of that of comparative example 2, and the etch factor K of embodiment 10 is 1.06 times of that of comparative example 2; embodiment 18 has an etching rate which is 1.92 times of that of comparative example 2, and its etch factor is 1.08 times of that of comparative example 2.

The pH value and the concentration of copper ions in comparative example 3 are the same as those in embodiment 9, but embodiment 9 has an etching rate which is 2.06 times of that of comparative example 3, and its etch factor is 1.17 times of that of comparative example 3.

The pH value and the concentration of copper ions in comparative example 4 are the same as those in embodiment 8, but embodiment 8 has an etching rate which is 2.34 times of that of comparative example 4, and its etch factor is 1.28 times of that of comparative example 4.

In summary, at the same pH and concentration of copper ions, the etching rates of etchants of the invention is higher than, and can be as high as more than twice of the etching rate of the prior art.

In addition, at pH<8.0, alkaline cupric chloride etchants in prior art cannot carry out proper etching operation. In contrast, etchants of the present invention maintain relatively high etching rates and good etching quality (e.g. embodiments 4-7, 12-15 and 20-30) at pH<8.0, so they can be used in the etching of PCBs coated with dry-film or liquid photoresists. Currently, acidic cupric chloride etchants are commonly used in the etching of such PCBs, and comparative example 5 is a commonly employed acidic cupric chloride etchant for such purpose. It can be seen in Table 2, when the pH of the alkaline cupric chloride etchants of the invention is low enough to etch PCBs coated with dry-film photoresists (pH<7.8) or liquid photoresists (pH<7.5), the etch factor is significantly larger than that of comparative example 5. Furthermore, a large amount of irritating acidic odour is produced due to evaporation of hydrochloric acid when applying acidic cupric chloride etchants during the etching process. In contrast, the alkaline cupric chloride etchants of the invention with pH 7.0-8.0 have almost no ammonia gas odour at working temperature (about 50° C.).

The results in Table 3 of testing the impact of etchant on liquid and dry film further illustrate that due to the relative high pH of the current alkaline cupric chloride etchants, corrosion of liquid and dry-film photoresists take place. The alkaline cupric chloride etchants of the present invention can be used in etching printed circuit boards coated with dry-film photoresists at pH<7.8, and can be applied to etch printed circuit boards coated with by liquid photoresists when pH<7.5.

TABLE 1

| Etching system | sub-etchant | | | | | | | | | Concentration of copper ions (g/L) | Parameters of automatic detection and charging control machine | |
| --- | --- | --- | --- | --- | --- | --- | --- | --- | --- | --- | --- | --- |
| | Formic acid (wt %) | Ammonium Formate (wt %) | Ammonium hydroxide (wt %) | Ammonium chloride (wt %) | water (wt %) | Citric acid (wt %) | Malic acid (wt %) | Ammonium citrate (wt %) | Ammonium malate (wt %) | | pH | Specific density (g/ml) |
| Comparative example | 0 | 0 | 20 | 20 | 58 | 0 | 0 | 0 | 0 | 130 | 8.8 | 1.19 |
| Comparative example 1 | 0 | 0 | 20 | 20 | 58 | 0 | 0 | 0 | 0 | 130 | 8.8 | 1.19 |
| Comparative example 2 | 0 | 0 | 20 | 20 | 58 | 0 | 0 | 0 | 0 | 120 | 8.6 | 1.18 |
| Comparative example 3 | 0 | 0 | 20 | 20 | 58 | 0 | 0 | 0 | 0 | 120 | 8.3 | 1.18 |
| Comparative example 4 | 0 | 0 | 20 | 20 | 58 | 0 | 0 | 0 | 0 | 120 | 8.0 | 1.18 |
| Embodiment 1 | 2.55 | 0 | 1 | 20 | 76.45 | 0 | 0 | 0 | 0 | 130 | 8.2 | 1.21 |
| Embodiment 2 | 0 | 2.55 | 0 | 20 | 77.45 | 0 | 0 | 0 | 0 | 130 | 8.2 | 1.21 |
| Embodiment 3 | 1.55 | 1 | 0.6 | 20 | 76.85 | 0 | 0 | 0 | 0 | 130 | 8.2 | 1.21 |
| Embodiment 4 | 2.55 | 0 | 1 | 20 | 76.45 | 0 | 0 | 0 | 0 | 120 | 7.0 | 1.20 |
| Embodiment 5 | 2.55 | 0 | 1 | 20 | 76.45 | 0 | 0 | 0 | 0 | 120 | 7.2 | 1.20 |
| Embodiment 6 | 2.55 | 0 | 1 | 20 | 76.45 | 0 | 0 | 0 | 0 | 120 | 7.4 | 1.20 |
| Embodiment 7 | 2.55 | 0 | 1 | 20 | 76.45 | 0 | 0 | 0 | 0 | 120 | 7.7 | 1.20 |
| Embodiment 8 | 2.55 | 0 | 1 | 20 | 76.45 | 0 | 0 | 0 | 0 | 120 | 8.0 | 1.20 |
| Embodiment 9 | 2.55 | 0 | 1 | 20 | 76.45 | 0 | 0 | 0 | 0 | 120 | 8.3 | 1.20 |
| Embodiment 10 | 2.55 | 0 | 1 | 20 | 76.45 | 0 | 0 | 0 | 0 | 120 | 8.6 | 1.21 |
| Embodiment 11 | 2.55 | 0 | 20 | 20 | 76.45 | 0 | 0 | 0 | 0 | 130 | 8.8 | 1.22 |
| Embodiment 12 | 2.55 | 0 | 1 | 20 | 76.45 | 0 | 0 | 0 | 0 | 30 | 7.8 | 1.11 |
| Embodiment 13 | 2.55 | 0 | 1 | 20 | 76.45 | 0 | 0 | 0 | 0 | 60 | 7.8 | 1.14 |
| Embodiment 14 | 2.55 | 0 | 1 | 20 | 76.45 | 0 | 0 | 0 | 0 | 90 | 7.8 | 1.17 |
| Embodiment 14 | 2.55 | 0 | 1 | 20 | 76.45 | 0 | 0 | 0 | 0 | 90 | 7.8 | 1.17 |
| Embodiment 15 | 2.55 | 0 | 1 | 20 | 76.45 | 0 | 0 | 0 | 0 | 114 | 7.8 | 1.19 |
| Embodiment 16 | 2.55 | 0 | 1 | 20 | 76.45 | 0 | 0 | 0 | 0 | 140 | 8.2 | 1.22 |
| Embodiment 17 | 2.55 | 0 | 1 | 20 | 76.45 | 0 | 0 | 0 | 0 | 170 | 8.2 | 1.25 |
| Embodiment 18 | 0.0002 | 0 | 25 | 30.0 | 44.9998 | 0 | 0 | 0 | 0 | 120 | 8.6 | 1.20 |
| Embodiment 19 | 0.81 | 0 | 0.5 | 23.0 | 75.69 | 0 | 0 | 0 | 0 | 120 | 8.2 | 1.20 |
| Embodiment 20 | 4.2 | 0 | 2 | 23.0 | 70.8 | 0 | 0 | 0 | 0 | 120 | 7.7 | 1.20 |
| Embodiment 21 | 8.5 | 0 | 10 | 23.0 | 58.5 | 0 | 0 | 0 | 0 | 120 | 7.7 | 1.20 |
| Embodiment 22 | 12.7 | 0 | 7 | 23.0 | 57.3 | 0 | 0 | 0 | 0 | 120 | 7.7 | 1.20 |
| Embodiment 23 | 17.0 | 0 | 9 | 23.0 | 51 | 0 | 0 | 0 | 0 | 120 | 7.7 | 1.20 |
| Embodiment 24 | 25 | 0 | 13 | 10 | 52 | 0 | 0 | 0 | 0 | 60 | 7.7 | 1.21 |
| Embodiment 25 | 2.55 | 0 | 1 | 25 | 71.45 | 0 | 0 | 0 | 0 | 80 | 7.7 | 1.16 |
| Embodiment 26 | 2.55 | 0 | 1 | 15 | 81.45 | 0 | 0 | 0 | 0 | 80 | 7.7 | 1.16 |
| Embodiment 27 | 2.55 | 0 | 1 | 10 | 86.45 | 0 | 0 | 0 | 0 | 80 | 7.7 | 1.16 |

TABLE 1-continued

| Etching system | sub-etchant | | | | | | | | Concentration of copper ions (g/L) | Parameters of automatic detection and charging control machine | |
|---|---|---|---|---|---|---|---|---|---|---|---|
| | Formic acid (wt %) | Ammonium Formate (wt %) | Ammonium hydroxide (wt %) | Ammonium chloride (wt %) | water (wt %) | Citric acid (wt %) | Malic acid (wt %) | Ammonium citrate (wt %) | Ammonium malate (wt %) | | pH | Specific density (g/ml) |
| Embodiment 28 | 0 | 0 | 1 | 20 | 76.45 | 1 | 0 | 0 | 0 | 120 | 7.5 | 1.20 |
| Embodiment 29 | 0 | 0 | 1 | 20 | 76.45 | 0 | 1.5 | 0 | 0 | 120 | 7.4 | 1.20 |
| Embodiment 30 | 1 | 0 | 0.3 | 20 | 76.45 | 0 | 0 | 0.7 | 0.8 | 120 | 7.4 | 1.20 |

TABLE 2

| Etching system | Etching rate (μm/min) | Etch factor K | Environmental impact |
|---|---|---|---|
| Comparative example 1 | 40.2 | 2.8 | Obvious ammonia smell |
| Comparative example 2 | 40.0 | 3.6 | Obvious ammonia smell |
| Comparative example 3 | 36.0 | 4.2 | Slight ammonia smell |
| Comparative example 4 | 28.6 | 4.7 | Slight ammonia smell |
| Comparative example 5 | 35 | 1.7 | Obvious acidic odour |
| Embodiment 1 | 49.5 | 5.3 | Slight ammonia smell |
| Embodiment 2 | 49.5 | 5.4 | Slight ammonia smell |
| Embodiment 3 | 49.5 | 5.4 | Slight ammonia smell |
| Embodiment 4 | 24.4 | 13.6 | Almost no ammonia smell |
| Embodiment 5 | 35.3 | 11.0 | Almost no ammonia smell |
| Embodiment 6 | 53.0 | 8.5 | Almost no ammonia smell |
| Embodiment 7 | 62.5 | 7.3 | Almost no ammonia smell |
| Embodiment 8 | 67.0 | 6.0 | Slight ammonia smell |
| Embodiment 9 | 74.1 | 4.9 | Slight ammonia smell |
| Embodiment 10 | 78.3 | 3.8 | Slight ammonia smell |
| Embodiment 11 | 78.6 | 3.1 | Obvious ammonia smell |
| Embodiment 12 | 18.2 | 6.9 | Almost no ammonia smell |
| Embodiment 13 | 39.1 | 6.9 | Almost no ammonia smell |
| Embodiment 14 | 64.6 | 6.8 | Almost no ammonia smell |
| Embodiment 15 | 61.1 | 7.0 | Almost no ammonia smell |
| Embodiment 16 | 76.0 | 5.3 | Slight ammonia smell |
| Embodiment 17 | 32.9 | 5.1 | Slight ammonia smell |
| Embodiment 18 | 76.9 | 3.9 | Obvious ammonia smell |
| Embodiment 19 | 41.2 | 5.2 | Slight ammonia smell |
| Embodiment 20 | 50.9 | 7.3 | Almost no ammonia smell |
| Embodiment 21 | 39.1 | 7.2 | Almost no ammonia smell |
| Embodiment 22 | 48.5 | 7.4 | Almost no ammonia smell |
| Embodiment 23 | 31.0 | 7.3 | Almost no ammonia smell |
| Embodiment 24 | 14.2 | 7.5 | Almost no ammonia smell |
| Embodiment 25 | 71.2 | 7.4 | Almost no ammonia smell |
| Embodiment 26 | 26.5 | 7.2 | Almost no ammonia smell |
| Embodiment 27 | 20.6 | 7.2 | Almost no ammonia smell |
| Embodiment 28 | 50.5 | 8.4 | Almost no ammonia smell |
| Embodiment 29 | 48.3 | 8.5 | Almost no ammonia smell |
| Embodiment 30 | 49.7 | 8.4 | Almost no ammonia smell |

TABLE 3

| Etching system | pH value | Type of photoresist | Observation of etch resist |
|---|---|---|---|
| Comparative example 1 | 8.8 | dry-film | No discolouration; partly striped after gentle scratching |
| | | liquid | No discolouration; partly striped after gentle scratching |
| Embodiment 4 | 7.0 | dry-film | Not discoloured, softened or striped |
| | | liquid | Not discoloured, softened or striped |
| Embodiment 28 | 7.5 | dry-film | Not discoloured, softened or striped |
| | | liquid | Not discoloured, softened or striped |
| Embodiment 15 | 7.8 | dry-film | Not discoloured, softened or striped |
| | | liquid | No discolouration; partly striped after gentle scratching |
| Embodiment 8 | 8.0 | dry-film | No discolouration; partly striped after gentle scratching |
| | | liquid | No discolouration; partly striped after gentle scratching |

What is claimed is:

1. A high-efficiency high-quality and safe alkaline cupric chloride etchant for printed circuit board, comprising cupric chloride and a sub-etchant, which comprises a temporary storage for ammonium ions during an etching process and said temporary storage is in the form of a reversible reaction as follows:

$$RCOOH+NH_4OH \Longleftrightarrow RCOONH_4+H_2O.$$

2. The high-efficiency high-quality and safe alkaline cupric chloride etchant for printed circuit board according to claim 1, wherein the sub-etchant comprises the following components in percentage by weight:
15%-30% $NH_4Cl$;
0.81%-12.7% carboxylic acid and/or ammonium carboxylate;
0.5%-25% ammonium hydroxide;
and the balance of water.

3. The high-efficiency high-quality and safe alkaline cupric chloride etchant for printed circuit board according to claim 2, wherein the sub-etchant comprises the following components in percentage by weight:
15%-25% $NH_4Cl$;
1%-8.5% carboxylic acid and/or ammonium carboxylate;
0.6%-20% ammonium hydroxide;
and the balance of water.

4. The high-efficiency high-quality and safe alkaline cupric chloride etchant for printed circuit board according to any one of claim 1, wherein the concentration of copper ions is 60-140 g/L, and the pH value is 7.0-8.0.

5. The high-efficiency high-quality and safe alkaline cupric chloride etchant for printed circuit board according to claim 4, wherein the carboxylic acid is one or more compounds selected from the group consisting of formic acid, citric acid and malic acid; the ammonium carboxylate is one or more compounds selected from the group consisting of ammonium formate, ammonium citrate and ammonium malate.

6. The high-efficiency high-quality and safe alkaline cupric chloride etchant for printed circuit board according to claim 5, wherein an automatic detection and charging control machine is used for additionally controlling the pH process parameter of the etchant during the etching process, so that the pH of the etchant is always within a set numerical range.

7. The high-efficiency high-quality and safe alkaline cupric chloride etchant for printed circuit board according to any one of claim 1, wherein the automatic detection and charging control machine is used for additionally controlling the pH process parameter of the etchant during etching process, so that the pH of the etchant is always within the set numerical range.

8. The high-efficiency high-quality and safe alkaline cupric chloride etchant for printed circuit board according to claim 7, wherein after the cupric chloride at an amount of not less than 1 g/L is pre-added, copper is selected and added instead of cupric chloride into the sub-etchant, and the initial amount C of copper added instead of cupric chloride into the sub-etchant=(set value of the concentration of copper ions A)−((pre-charging amount of cupric chloride B')×63.5÷134.5) g/L.

9. A process of utilising the alkaline cupric chloride etchant according to any one of claim 1 for an etching operation, employing an automatic detection and charging control machine with a specific density control system to control the amount of each component in the etchant, characterised in that an automatic detection and charging system for ammonium hydroxide is added onto the automatic detection and charging control machine, in order to monitor the pH value of the etchant in real time; the etchant is subdivided into the following three components; the three components are respectively placed in a corresponding supplement tank, so that each of the components is charged by the automatic detection and charging control machine according to changes of its corresponding process parameters during the etching process:
(1) sub-etchant: a mixture of aqueous solutions of ammonium chloride, carboxylic acid and/or ammonium carboxylate, and ammonium hydroxide;
(2) ammonium hydroxide as a separate component, so that the said ammonium hydroxide is added as required during the real-time monitoring of the pH of the etchant;
(3) cupric chloride;
said process comprising the steps of:
Step 1 preparing the sub-etchant: at ambient temperature and pressure, according to designated components of the sub-etchant and their mixing ratio, selected raw materials are dissolved in water to prepare the sub-etchant;
Step 2 calculating the initial charging amount of the cupric chloride: the cupric chloride is added into the sub-etchant obtained in step 1 according to a set value of the concentration of copper ions; the initial charging amount B of the cupric chloride is calculated according to the following formula:

$$B=(134.5/63.5)\times \text{set value } A \text{ of the concentration of copper ions};$$

Step 3 Setting up specific density and pH value detection: the solution obtained in step 2 is poured into an etchant tank on a printed circuit board production line, and sensor probes of the specific density control system and the automatic detection and charging system for ammonium hydroxide are immersed into the etchant, in order to detect and control the specific density and the pH value of the etchant;
Step 4 Replenishing the supplement tanks: the sub-etchant prepared in step 1 is poured into the sub-etchant supplement tank; the sub-etchant supplement tank is connected to the specific density control system; the ammonium hydroxide is poured into the ammonium hydroxide supplement tank; the ammonium hydroxide tank is connected to the automatic detection and charging system for ammonium hydroxide;
Step 5 Setting the process parameters: the temperature of the etchant tank is set to 45-50° C., the pressure of spray nozzles of the automatic detection and charging control machine is set to 2-3 kg/cm2, charging control point of the specific density control system is set according to the reading of a hydrometer in the specific density control system of the automatic detection and charging control machine, and pH charging control point of the automatic detection and charging system for ammonium hydroxide is set according to a prescribed pH value; the automatic detection and charging control machine is started and the alkaline cupric chloride etchant is prepared;
Step 6 Conducting the etching operation: the etching operation is started; the various process parameters are measured by the automatic detection and charging control machine during the etching operation; the machine automatically controls the supplementation of the various components of the etchant, thereby balancing the amount of each component in the etchant.

10. A process of utilising the alkaline cupric chloride etchant according to claim 4 for an etching operation, employing an automatic detection and charging control machine with a specific density control system to control the amount of each component in the etchant, characterised in that an automatic detection and charging system for ammonium hydroxide is added onto the automatic detection and charging control machine, in order to monitor the pH value of the etchant in real time; the etchant is subdivided into the following three components, the three components are respectively placed in a corresponding supplement tank, so that each of the components is charged by the automatic detection and charging control machine according to changes of its corresponding process parameters during the etching process:

(4) sub-etchant: a mixture of aqueous solutions of ammonium chloride, carboxylic acid and/or ammonium carboxylate, and ammonium hydroxide;

(5) ammonium hydroxide as a separate component, so that the said ammonium hydroxide is added as required during the real-time monitoring of the pH of the etchant;

(6) cupric chloride;

said process comprising the steps of:

Step 1 preparing the sub-etchant: at ambient temperature and pressure, according to designated components of the sub-etchant and their mixing ratio, selected raw materials are dissolved in water to prepare the sub-etchant;

Step 2 calculating the initial charging amount of the cupric chloride: the cupric chloride is added into the sub-etchant obtained in step 1 according to a set value of the concentration of copper ions; the initial charging amount B of the cupric chloride is calculated according to the following formula:

$B=(134.5/63.5)\times$ set value $A$ of the concentration of copper ions;

Step 3 Setting up specific density and pH value detection: the solution obtained in step 2 is poured into an etchant tank on a printed circuit board production line, and sensor probes of the specific density control system and the automatic detection and charging system for ammonium hydroxide are immersed into the etchant, in order to detect and control the specific density and the pH value of the etchant;

Step 4 Replenishing the supplement tanks: the sub-etchant prepared in step 1 is poured into the sub-etchant supplement tank, the sub-etchant supplement tank is connected to the specific density control system; the ammonium hydroxide is poured into the ammonium hydroxide supplement tank, the ammonium hydroxide supplement tank is connected to the automatic detection and charging system for ammonium hydroxide;

Step 5 Setting the process parameters: the temperature of the etchant tank is set to 45-50° C., the pressure of spray nozzles of the automatic detection and charging control machine is set to 2-3 kg/cm2, charging control point of the specific density control system is set according to the reading of a hydrometer in the specific density control system of the automatic detection and charging control machine, and pH charging control point of the automatic detection and charging system for ammonium hydroxide is set according to a prescribed pH value; the automatic detection and charging control machine is started and the alkaline cupric chloride etchant is prepared;

Step 6 Conducting the etching operation: the etching operation is started; the various process parameters are measured by the automatic detection and charging control machine during the etching operation; the machine automatically controls the supplementation of the various components of the etchant, thereby balancing the amount of each component in the etchant.

11. A process of utilising the alkaline cupric chloride etchant for an etching operation according to claim 9 or 10, characterised in that the concentration of the ammonium hydroxide as a separate component is 15%-25%.

12. The high-efficiency high-quality and safe alkaline cupric chloride etchant for printed circuit board according to any one of claim 2, characterised in that the concentration of copper ions is 60-140 g/L, the pH value is 7.0-8.0.

13. The high-efficiency high-quality and safe alkaline cupric chloride etchant for printed circuit board according to any one of claim 3, characterised in that the concentration of copper ions is 60-140 g/L, the pH value is 7.0-8.0.

14. The high-efficiency high-quality and safe alkaline cupric chloride etchant for printed circuit board according to any one of claim 2, characterised in that the automatic detection and charging control machine is used for additionally controlling the pH process parameter of the etchant during etching process, so that the pH of the etchant is always within the set numerical range.

15. The high-efficiency high-quality and safe alkaline cupric chloride etchant for printed circuit board according to any one of claim 3, characterised in that the automatic detection and charging control machine is used for additionally controlling the pH process parameter of the etchant during etching process, so that the pH of the etchant is always within the set numerical range.

* * * * *